US006424327B2

(12) United States Patent
Havel

(10) Patent No.: US 6,424,327 B2
(45) Date of Patent: *Jul. 23, 2002

(54) MULTICOLOR DISPLAY ELEMENT WITH ENABLE INPUT

(75) Inventor: Karel Havel, Bramalea (CA)

(73) Assignee: Texas Digital Systems, Inc.

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/373,437

(22) Filed: Aug. 11, 1999

Related U.S. Application Data

(62) Division of application No. 08/910,080, filed on Aug. 12, 1997, now Pat. No. 6,018,237, which is a division of application No. 08/571,246, filed on Dec. 12, 1995, now Pat. No. 5,656,935, which is a division of application No. 08/187,350, filed on Jan. 27, 1994, now Pat. No. 5,475,300, which is a division of application No. 07/865,460, filed on Apr. 9, 1992, now Pat. No. 5,283,517, which is a division of application No. 07/628,328, filed on Dec. 14, 1990, now Pat. No. 5,122,733, which is a division of application No. 07/197,322, filed on May 23, 1988, now abandoned, which is a division of application No. 06/819,111, filed on Jan. 15, 1986, now Pat. No. 4,794,383.

(51) Int. Cl.[7] .................................................. G09G 3/32
(52) U.S. Cl. ........................ 345/83; 345/589; 324/115
(58) Field of Search ............................ 345/82, 83, 150, 345/589; 324/115, 96; 313/500, 501; 257/89, 90

(56) References Cited

U.S. PATENT DOCUMENTS 2,643,344 A   6/1953   McLaren et al.

(List continued on next page.)

FOREIGN PATENT DOCUMENTS

| DE | 3037-500 | 4/1981 |
| DE | 3009416 | 9/1981 |
| DE | 220844 A | 4/1985 |
| GB | 2158631 A | 11/1985 |
| JP | 57146112 | 9/1982 |

OTHER PUBLICATIONS

Wagner, B., "2–color LED+Driver=Versatile Visual Effects", EDN vol. 25, No. 19, Oct. 20, 1980.

(List continued on next page.)

Primary Examiner—Steven Saras
Assistant Examiner—Amr Awad
(74) Attorney, Agent, or Firm—James J. Murphy, Esq.; Winstead Sechrest & Minick, P.C.

(57) ABSTRACT

A multicolor display element includes a plurality of display areas arranged in a pattern, each including light emitting diodes of respective primary colors, which are coupled to the buses in accordance with their colors. A single enable input is provided for receiving an enable signal having an active level and an inactive level, for selectively extinguishing the entire display element and for illuminating the selected display areas in a desired color. The enable input jointly controls the conductivity of tri-state buffers which are respectively coupled to the buses.

2 Claims, 4 Drawing Sheets

U.S. PATENT DOCUMENTS

| | | |
|---|---|---|
| 2,648,015 A | 8/1953 | Greenfield et al. |
| 2,682,000 A | 6/1954 | Clayton et al. |
| 2,878,450 A | 3/1959 | Rabier |
| 2,889,518 A | 6/1959 | Hudson et al. |
| 3,590,156 A | 6/1971 | Easton |
| 3,595,991 A | 7/1971 | Diller |
| 3,696,393 A | 10/1972 | McDonald |
| 3,719,849 A | 3/1973 | Steward |
| 3,740,570 A | 6/1973 | Kaelin et al. |
| 3,760,174 A | 9/1973 | Boening et al. |
| 3,771,015 A | 11/1973 | Miller |
| 3,771,155 A | 11/1973 | Hayashi et al. |
| 3,840,873 A | 10/1974 | Usui |
| 3,873,979 A | 3/1975 | Craford et al. |
| 3,875,456 A | 4/1975 | Kano et al. |
| 3,911,418 A | 10/1975 | Takeda |
| 3,911,430 A | 10/1975 | Jankowski et al. |
| 3,924,227 A | 12/1975 | Stolov |
| 3,947,840 A | 3/1976 | Craford et al. |
| 3,975,726 A | 8/1976 | Kawakami |
| 3,987,401 A | 10/1976 | Irving |
| 4,086,514 A | 4/1978 | Havel |
| 4,201,039 A | 5/1980 | Marion |
| 4,204,424 A * | 5/1980 | Walker ........................ 73/23.4 |
| 4,232,312 A | 11/1980 | Eccles et al. |
| 4,271,408 A | 6/1981 | Teshima et al. |
| 4,301,450 A | 11/1981 | Smoliar |
| 4,360,804 A | 11/1982 | Ohura |
| 4,367,471 A * | 1/1983 | Gillessen ............... 340/825.82 |
| 4,445,132 A * | 4/1984 | Ichikawa et al. ............. 257/72 |
| 4,488,149 A | 12/1984 | Givens, Jr. |
| 4,491,974 A | 1/1985 | Bouchant |
| 4,525,729 A | 6/1985 | Agulnek et al. |
| 4,559,480 A | 12/1985 | Nobs |
| 4,581,612 A | 4/1986 | Jones |
| 4,644,342 A | 2/1987 | Abbas |
| 4,647,217 A | 3/1987 | Havel |
| 4,689,613 A | 8/1987 | Ikeda |
| 4,709,230 A | 11/1987 | Popowski et al. |
| 4,712,099 A | 12/1987 | Maeda |
| 4,713,579 A | 12/1987 | Miura |
| 4,720,709 A | 1/1988 | Imamura et al. |
| 4,723,119 A | 2/1988 | Morimoto |
| 4,725,828 A | 2/1988 | Cowlishaw |
| 4,740,818 A | 4/1988 | Tsilibes et al. |
| 4,755,807 A | 7/1988 | Guennou |
| 4,771,274 A | 9/1988 | Havel |
| 4,788,535 A | 11/1988 | Chikara et al. |
| 4,831,326 A | 5/1989 | Havel |
| 4,837,565 A | 6/1989 | White |
| 4,845,481 A | 7/1989 | Havel |
| 5,003,298 A | 3/1991 | Havel |
| 5,184,114 A | 2/1993 | Brown |
| 5,561,365 A | 10/1996 | Havel |
| 6,018,237 A * | 1/2000 | Havel ........................ 324/115 |
| 6,121,767 A | 9/2000 | Havel |
| 6,133,722 A | 10/2000 | Havel |
| 6,147,483 A | 11/2000 | Havel |
| 6,239,776 B1 | 5/2001 | Havel |

OTHER PUBLICATIONS

Smithline, L.M., "Dual light emitting diode synthesizes polychromatic light", Electronics, Aug. 16, 1979, p. 130.

Svestka, M. et al, "LEDs change color to indicate balance voltage", Electronic Engineering, vol. 48, no. 576, p. 19, Feb. 1976.

Saitoh, T. et al. "Multicolor light–emitting diodes with double junction structure". IEEE Transactions on Electron Devices, Feb. 1975, vol. ED–22, No. 2, pp. 29–32.

Yamaguchi, T. et al, "A High Brightness Gap Multicolor LED", IEEE Transactions on Electron Devices, vol. ED–28, No. 5, May 1981, pp. 588–592.

Burke, M., "Chip changes the color of light–emitting diodes", Electronics, Apr. 7, 1981, pp. 158–159.

Rao, V., Two LEDs blend and blink to indicate six states. Electronic Design, vol. 30, No. 16, p. 220, Aug. 5, 1982.

Kojima, T. "Recent flat panel development in Japan", held in San Diego, CA, 29 Apr.–May 1, 1980. SID 80 Digest, pp. 22–23.

Niina, T. et al, "A multi–color GaP LED flat panel display device" New York, NY, USA, Apr. 28–30, 1981. 1981 SID International Symposium Digest of Papers, vol. XII (1981), pp. 140–141.

Niina, T. et al, "A multi–color LED flat panel display device for colorful displays of letters and figures". Proceedings of the SID, vol. 23, No. 2, pp. 73–76, 1982.

O'Mara, P.A. et al, "Microprocessor–controlled light–emitting diode dark adaptometer". Medical & Biological Engineering and Computing, vol. 20, No. 1, pp. 70–76, 1982.

Landauer, R. W., "Electroluminescent Display", IBM Technical Disclosure Bulletin, vol. 8, No. 11, pp. 15–16, Apr. 11, 1966.

SenSym Solid State Barometers Catalog, pp. 9–30, 1983.

* cited by examiner

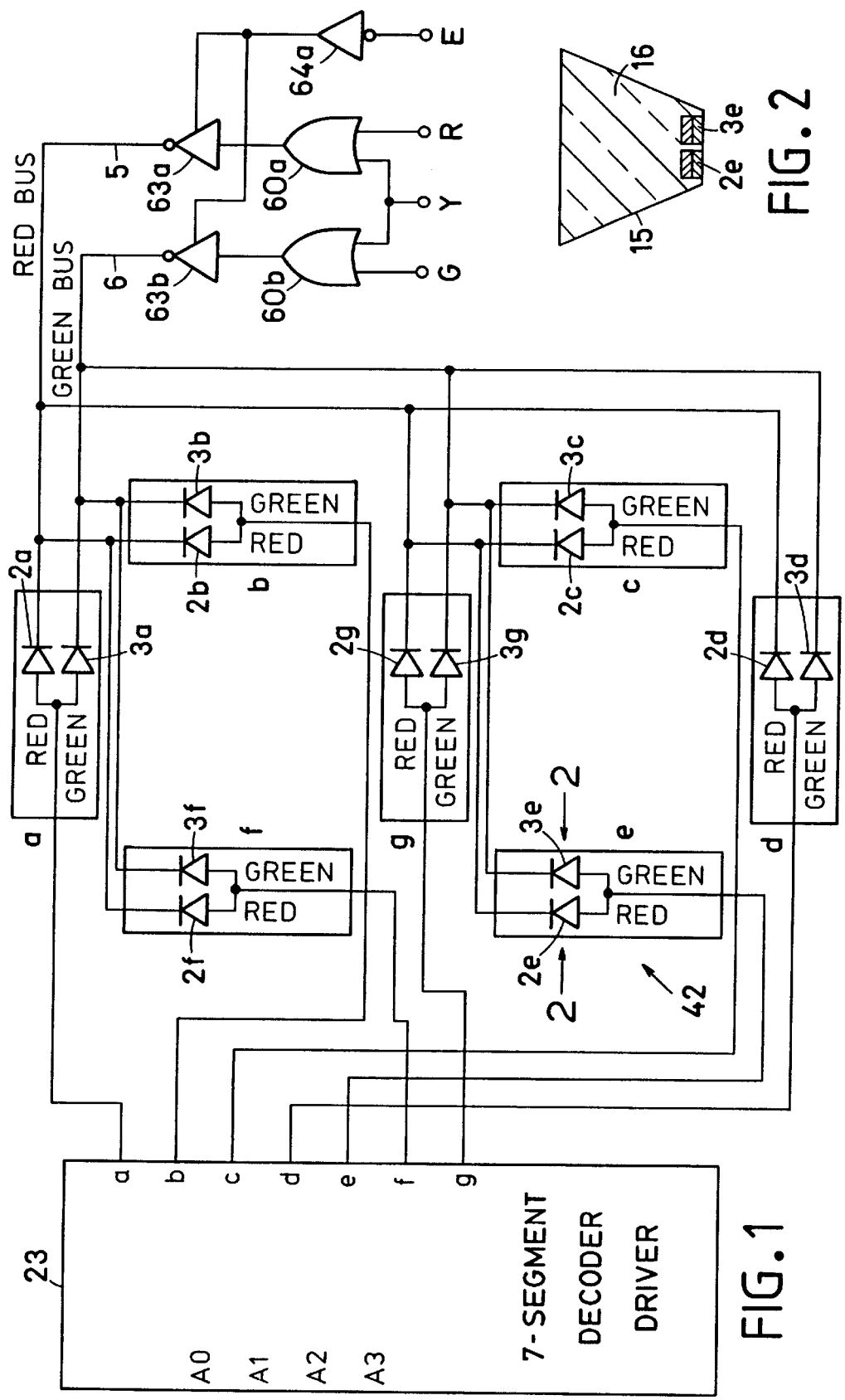

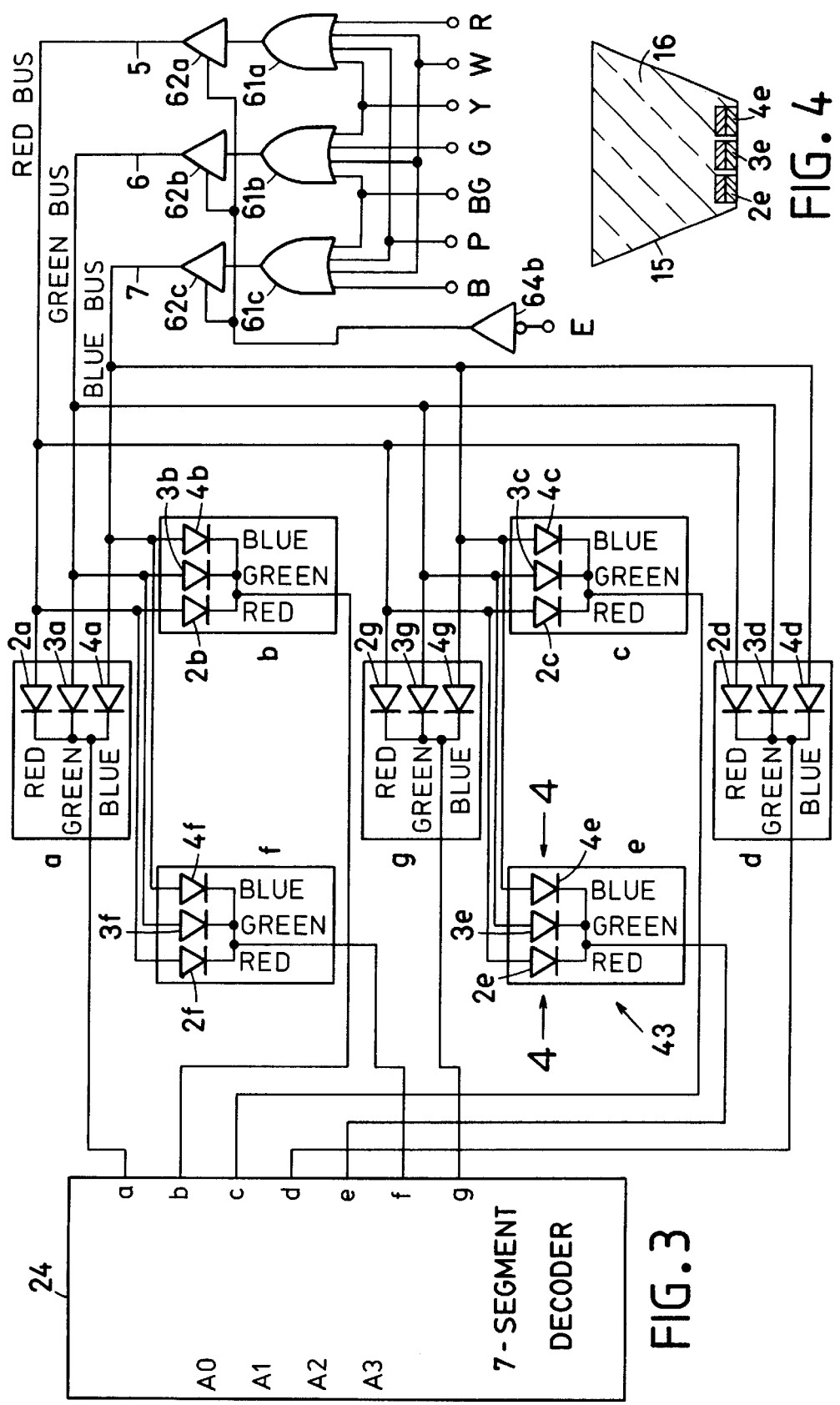

MULTICOLOR DISPLAY ELEMENT WITH ENABLE INPUT

CROSS-REFERENCE TO RELATED APPLICATIONS

This is a division of my application Ser. No. 08/910,080, filed on Aug. 12, 1997, now U.S. Pat. No. 6,018,237 entitled Variable Color Display System, which is a division of my application Ser. No. 08/571,246, filed on Dec. 12, 1995, entitled Variable Color Display System, now U.S. Pat. No. 5,656,935 issued on Aug. 12, 1997, which is a division of my application Ser. No. 08/187,350, filed on Jan. 27, 1994, entitled Variable Color Digital Multimeter, now U.S. Pat. No. 5,475,300 issued on Dec. 12, 1995, which is a division of my application Ser. No. 07/865,460, filed on Apr. 9, 1992, entitled Variable Color Digital Multimeter, now U.S. Pat. No. 5,283,517 issued on Feb. 1, 1994, which is a division of my application Ser. No. 07/628,328, filed on Dec. 14, 1990, entitled Variable Color Digital Multimeter, now U.S. Pat. No. 5,122,733 issued on Jun. 16, 1992, which is a division of my application Ser. No. 07/197,322, filed on May 23, 1988, entitled Variable Color Digital Multimeter, now abandoned, which is a division of my application Ser. No. 06/819,111, filed on Jan. 15, 1986, entitled Variable Color Digital Multimeter, now U.S. Pat. No. 4,794,383 issued on Dec. 27, 1988.

Reference is also made to my related applications Ser. No. 06/817,114, filed on Jan. 8, 1986, entitled Variable Color Digital Timepiece, now U.S. Pat. No. 4,647,217 issued on Mar. 3, 1987, Ser. No. 06/839,526, filed on Mar. 14, 1986, entitled Variable Color Display Telephone, now U.S. Pat. No. 4,726,059 issued on Feb. 16, 1988, Ser. No. 06/940,100, filed on Dec. 10, 1986, entitled Digital Voltmeter with Variable Color Background, now U.S. Pat. No. 4,831,326 issued on May 16, 1989, Ser. No. 06/922,847, filed on Oct. 24, 1986, entitled Continuously Variable Color Display Device, now U.S. Pat. No. 4,845,481 issued on Jul. 4, 1989, Ser. No. 07/322,341, filed on Mar. 13, 1989, entitled Continuously Variable Color Optical Device, now U.S. Pat. No. 4,965,561 issued on Oct. 23, 1990, Ser. No. 06/920,740, filed on Oct. 20, 1986, entitled Step Variable Color Display Device, now abandoned, Ser. No. 06/931,626, filed on Nov. 17, 1986, entitled Variable Color Hybrid Display Device, now abandoned, and Ser. No. 07/157,603, filed on Feb. 19, 1988, entitled Variable Color Multiplexed Display System, now abandoned, which describe devices employing a multicolor color display.

BACKGROUND OF THE INVENTION

1. Field of the Invention

This invention relates to multicolor display devices utilizing light emitting diodes.

2. Description of the Prior Art

An electronic display having segments wherein each segment is capable of selectively illuminating two colors is disclosed in U.S. Pat. No. 4,488,149 issued on Dec. 11, 1984 to William A. Givens, Jr. Two AND gates are provided for biasing, in each display segment, either a first light emitting diode, for emitting a first color, or a second light emitting diode, for emitting a second color. It is not contemplated to illuminate both light emitting diodes in each segment simultaneously for blending the colors. A multi-element display is not contemplated.

A driving circuit for light emitting diodes, disclosed in U.S. Pat. No. 3,740,570, issued on Jun. 19, 1973 to George R. Kaelin et al., uses special light emitting diodes which emit different color light in response to different currents. The driving circuit selects either a relatively high current for green display, or a relatively low current for red display, or an intermediate current for yellow display, by selectively applying pulses of different amplitudes to the light emitting diodes. The display device is not capable of producing other colors. It is not contemplated that light signals of primary colors may be blended.

A multi-color LED display for seven segment figures is disclosed in German Patent No. 3,009,416 issued on Sep. 17, 1981 to Klaus Gillessen. The LED circuit consists of seven group of diodes, each group made up of two diodes, one red and one green. The cathodes of all red diodes are terminated in a common connection, and the green ones likewise, the anodes of each pair of diodes being common for that pair. Two transistors connected in cascade are utilized for activating either all green LEDs, or all red LEDs, but not both simultaneously. When a low level signal is applied to the base of the first transistor, the first transistor is blocked, and the second transistor is turned ON to illuminate the second set of the diodes. When a high level signal is applied to the input of the first transistor, the first transistor is turned ON, while the second transistor is blocked, whereby the first set of the diodes is illuminated. Since the first transistor cannot be simultaneously turned ON and OFF, it would be impossible to illuminate the two sets of the diodes simultaneously. In another embodiment is shown a multi-color LED display utilizing three sets of LEDs: red, green, and blue, which are respectively commonly connected and may be activated by manual switches. It is not contemplated that the three sets of LEDs be activated in selective combinations to blend the colors.

A digital electrooptical display with anti-parallel light emitting diodes is disclosed in East German Patent No. 220,844 issued on Apr. 10, 1985 to Thomas Hoffmann et al. Two light emitting diodes for emitting light of different colors are connected in each segment back-to-back. Since the light emitting diodes are connected to conduct currents in opposite directions, it would be impossible to illuminate them simultaneously, because the opposite currents attempting to pass through a single conductor would cancel.

The prior art does not contemplate a multicolor display element which includes a plurality of display areas with light emitting diodes of respective primary colors, and which also includes a single enable input, for receiving an enable signal, for either extinguishing the entire display element or for illuminating the selected display areas in a desired color.

SUMMARY OF THE INVENTION

It is the principal object of this invention to provide an improved multicolor display device.

It is another object of the invention to provide a multicolor display element using two primary color light emitting diodes and including an enable input.

It is still another object of the invention to provide a multicolor display element using three primary color light emitting diodes and including an enable input.

It is still another object of the invention to provide a multicolor display element including a plurality of buses, to which the light emitting diodes of primary colors are connected in accordance with their colors, and a plurality of color control inputs for the respective buses.

It is still another object of the invention to provide a multicolor display element including a plurality of tri-state buffers, each interposed between the color control input and the bus.

It is still another object of the invention to provide a multicolor display element including a plurality of tri-state buffers, each of them may be selectively controlled to be conductive and non-conductive.

Other objects of the invention will be obvious from the appended drawings and their description.

In summary, a multicolor display element of the invention includes a plurality of display areas, each including light emitting diodes of respective primary colors. The buses are provided, to which the light emitting diodes are coupled in-accordance with their colors. Each bus includes a color control input for receiving color control signals.

The invention resides in the addition of tri-state buffers, each interposed between the color control input and the corresponding bus, which may be commonly controlled, by a single enable input, to be conductive and non-conductive.

A new and unexpected result was achieved by the instant invention: it is possible to interconnect the color control inputs of multiple display elements, to commonly present the color control signals to the interconnected color control inputs, and to control the individual display elements by their respective enable inputs to be either extinguished or illuminated in a color in accordance with the color control signals. The prior art does not contemplate such a display system.

BRIEF DESCRIPTION OF THE DRAWINGS

In the drawings in which are shown the preferred embodiments of the invention,

FIG. 1 is a schematic diagram of a single 2-primary color 7-segment display element.

FIG. 2 is an enlarged cross-sectional view of one display segment in FIG. 1, taken along the line 2—2.

FIG. 3 is a schematic diagram of a single 3-primary color 7-segment display element.

FIG. 4 is an enlarged cross-sectional view of one display segment in FIG. 3, taken along the line 4—4.

Throughout the drawings, like characters indicate like parts.

DESCRIPTION OF THE PREFERRED EMBODIMENTS

Figure 5:
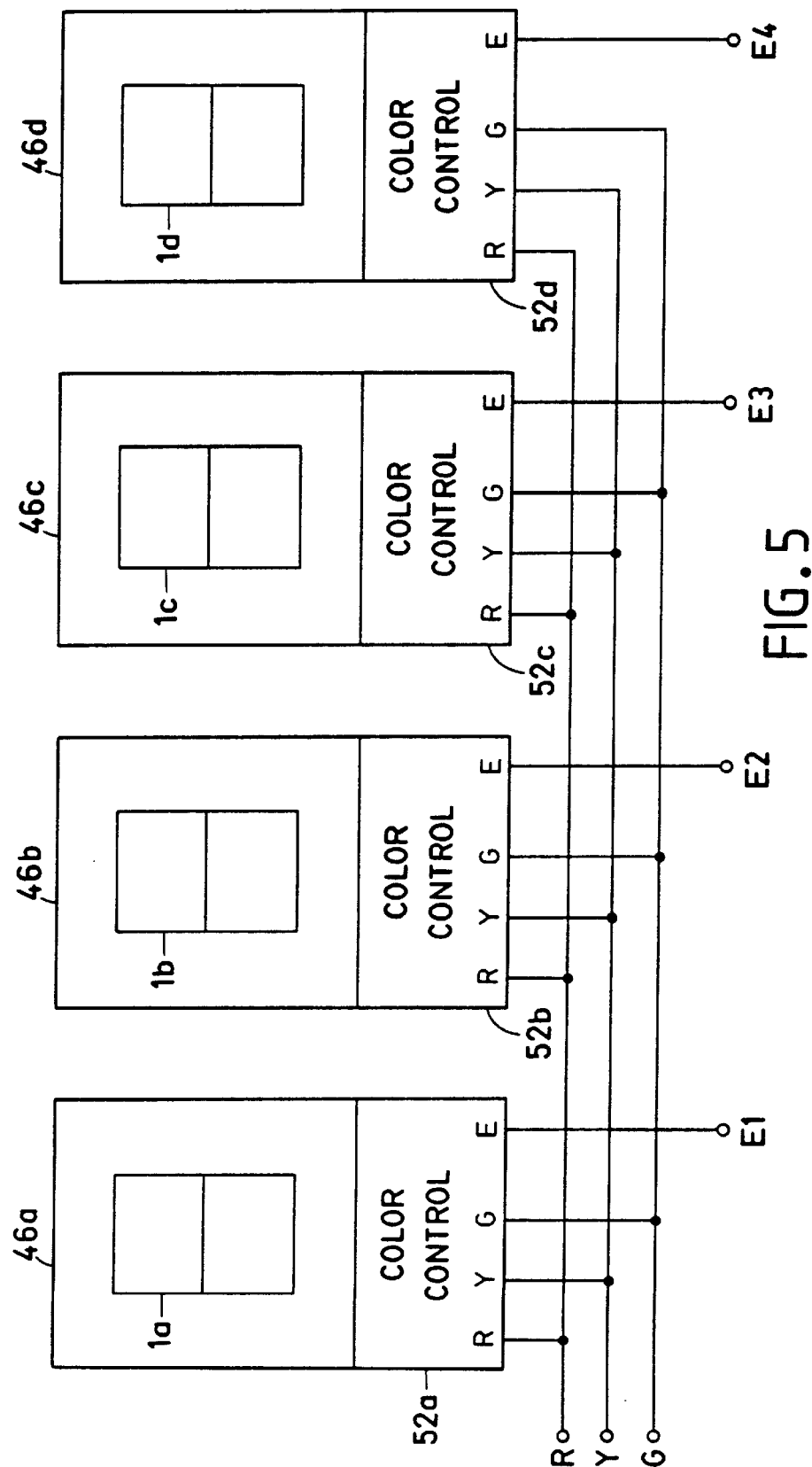
FIG. 5 is a block diagram of a 2-primary color multicolor 4-digit display.

Referring now, more particularly, to the drawings, in FIG. 1 is shown a schematic diagram of a 2-primary color common cathodes 7-segment display element 42 which can selectively display various digital fonts in different colors on display segments a, b, c, d, e, f, g, and DP (Decimal Point). Each display segment includes a pair of LEDs (light emitting diodes): red LED 2 and green LED 3, which are closely adjacent such that the light signals emitted therefrom are substantially superimposed upon each other to mix the colors. To facilitate the illustration, the LEDs are designated by segment symbols, e. g., the red LED in the segment a is designated as 2a, etc.

The anodes of all red and green LED pairs are interconnected in each display segment and are electrically connected to respective outputs of a commercially well known common-cathode 7-segment decoder 23. The cathodes of all red LEDs 2a, 2b, 2c, 2d, 2e, 2f, 2g, and DP are interconnected to a common electric path referred to as a red bus 5.

The cathodes of all green LEDs 3a, 3b, 3c, 3d, 3e, 3f, 3g, and DP are interconnected to a like common electric path referred to as a green bus 6.

The red bus 5 is connected to the output of a tri-state inverting buffer 63a, capable of sinking sufficient current to forwardly bias all red LEDs 2a to 2i in display element 42. The green bus 6 is connected to the output of a like buffer 63b. The conditions of red bus 5 and green bus 6 can be controlled by applying valid combinations of logic level control signals to color control inputs R (red), Y (yellow), and G (green), to illuminate display element 42 in a selected color.

The tri-state inverting buffers 63a and 63b can be simultaneously enabled by applying a logic low level signal to the input E of an inverter 64a, and disabled by applying a logic high level signal therein. When tri-state inverting buffers 63a and 63b are jointly enabled, the conditions of red bus 5, green bus 6, and blue bus 7 can be selectively controlled by applying valid combinations of logic level signals to color control inputs R, Y, and G, for illuminating display element 42 in a selected color. When tri-state inverting buffers 63a and 63b are jointly disabled, all three buses are effectively disconnected, and display element 42 is extinguished.

The color control inputs R, Y, G are applied to the inputs of two 2-input OR gates 60a, 60b, whose outputs respectively drive inverting buffers 63a, 63b. Color control R is applied directly to the input of OR gate 60a. In a similar fashion, color control input G is applied directly to the input of OR gate 60b. However, color control input Y is applied simultaneously to the inputs of both OR gates 60a, 60b.

The operation of display element 42 will be now explained by the example of illuminating a digit '7' in three different colors. Any digit between 0 and 9 can be selectively displayed by applying the appropriate BCD code to the inputs A0, A1, A2, and A3 of common-cathode 7-segment decoder 23. The decoder 23 develops at its outputs a, b, c, d, e, f, g, and DP drive signals for energizing selected groups of the segments to visually display the selected number, in a manner well known to those skilled in the art. To display decimal number '7', a BCD code 0111 is applied to the inputs A0, A1, A2, and A3. The decoder 23 develops high voltage levels at its outputs a, b, and c, to illuminate equally designated segments a, b, and c, and low voltage levels at all remaining outputs (not shown), to extinguish all remaining segments d, e, f, g, and DP.

To illuminate display element 42 in red color, color control input R is raised to a high logic level, and color control inputs Y and G are maintained at a low logic level. As a result, the output of OR gate 60a rises to a high logic level, thereby causing the output of buffer 63a to drop to a low logic level. The current flows from the output a of decoder 23, via red LED 2a and red bus 5, to current sinking output of buffer 63a. Similarly, the current flows from the output b of decoder 23, via red LED 2b and red bus 5, to the output of buffer 63a. The current flows from the output c of decoder 23, via red LED 2c and red bus 5, to the output of buffer 63a. As a result, segments a, b, and c illuminate in red color, thereby causing a visual impression of a character '7'. The green LEDs 3a, 3b, and 3c remain extinguished because the output of buffer 63b is at a high logic level, thereby disabling green bus 6.

To illuminate display element 42 in green color, color control input G is raised to a high logic level, while color control inputs R and Y are maintained at a low logic level. As a result, the output of OR gate 60b rises to a high logic level, thereby causing the output of buffer 63b to drop to a low logic level. The current flows from the output a of decoder 23, via green LED 3a and green bus 6, to current sinking output of buffer 63b. Similarly, the current flows from the output b of decoder 23, via green LED 3b and green bus 6, to the output of buffer 63b. The current flows from the output c of decoder 23, via green LED 3c and green bus 6, to the output of buffer 63b. As a result, segments a, b, and c illuminate in green color. The red LEDs 2a, 2b, and 2c remain extinguished because the output of buffer 63a is at a high logic level, thereby disabling red bus 5.

To illuminate display element 42 in yellow color, color control input Y is raised to a high logic level, while color inputs R and G are maintained at a low logic level. As a result, the outputs of both OR gates 60a and 60b rise to a high logic level, thereby causing the outputs of both buffers 63a and 63b to drop to a low logic level. The current flows from the output a of decoder 23, via red LED 2a and red bus 5, to current sinking output of buffer 63a, and, via green LED 3a and green bus 6, to current sinking output of buffer 63b. Similarly, the current flows from the output b of decoder 23, via red LED 2b and red bus 5, to the output of buffer 63a, and, via green LED 3b and green bus 6, to the output of buffer 63b. The current flows from the output c of decoder 23, via red LED 2c and red bus 5, to the output of buffer 63a, and, via green LED 3c and green bus 6, to the output of buffer 63b. As a result of blending light of red and green colors in each segment, segments a, b, and c illuminate in substantially yellow color.

In FIG. 2, red LED 2e and green LED 3e are placed on the base of a segment body 15 which is filled with a transparent light scattering material 16. When forwardly biased, LEDs 2e and 3e emit light signals of red and green colors, respectively, which are scattered within transparent material 16, thereby blending the red and green light signals into a composite light signal that emerges at the upper surface of segment body 15. The color of the composite light signal may be controlled by varying the portions of the red and green light signals.

In FIG. 3 is shown a schematic diagram of a one-character 3-primary color common anodes 7-segment display element 43 which can selectively display digital fonts in different colors. Each display segment a, b, c, d, e, f, and g includes a triad of LEDs: red LED 2, green LED 3, and blue LED 4, which are closely adjacent such that the light signals emitted therefrom are substantially superimposed upon one another to mix the colors.

The cathodes of all red, green, and blue LED triads in each display segment a, b, c, d, e, f, and g are interconnected and electrically connected to respective outputs of a commercially well known common anode 7-segment decoder 24. The anodes of all red LEDs 2a, 2b, 2c, 2d, 2e, 2f, and 2g are interconnected to form a common electric path referred to as red bus 5. The anodes of all green LEDs 3a, 3b, 3c, 3d, 3e, 3f, and 3g are interconnected to form a like common electric path referred to as green bus 6. The anodes of all blue LEDs 4a, 4b, 4c, 4d, 4e, 4f, and 4g are interconnected to form a like common electric path referred to as blue bus 7.

The red bus 5 is connected to the output of a tri-state non-inverting buffer 62a, capable of sourcing sufficient current to illuminate all red LEDs in display element 43. The green bus 6 is connected to the output of a like tri-state non-inverting buffer 62b. The blue bus 7 is connected to the output of a like tri-state non-inverting buffer 62c. The conditions of red bus 5, green bus 6, and blue bus 7 can be selectively controlled by applying valid combinations of logic level signals to color control inputs B (Blue), P (Purple), BG (Blue-Green), G (Green), Y (Yellow), W (White), and R (Red).

The tri-state non-inverting buffers 62a, 62b, and 62c can be simultaneously enabled by applying a logic low level signal to the input E of an inverter 64b, and disabled by applying a logic high level signal therein. When all tri-state non-inverting buffers 62a, 62b, and 62c are enabled, the conditions of red bus 5, green bus 6, and blue bus 7 can be selectively controlled by applying valid combinations of logic level signals to color control inputs B, P, BG, G, Y, W, and R, for illuminating display element 43 in a selected color. When all tri-state non-inverting buffers 62a, 62b, and 62c are disabled, all three buses are effectively disconnected; and display element 43 is extinguished.

The color control inputs B, P, BG, G, Y, W, R are applied to the inputs of three 4-input OR gates 61a, 61b, and 61c, whose outputs respectively drive non-inverting buffers 62a, 62b, 63c. Color control R is applied directly to the input of OR gate 61a; color control input G is applied directly to the input of OR gate 61b; color control input B is applied directly to the input of OR gate 61c. Color control input Y is applied simultaneously to the inputs of both OR gates 61a, 61b; color control input BG is applied simultaneously to the inputs of OR gates 61b, 61c; color control input P is applied simultaneously to the inputs of both OR gates 61a, 61c. Color control input W is applied simultaneously to the inputs of all three OR gates 61a, 61b, 61c.

The operation of 3-primary color 7-segment display element 43 shown in FIG. 3 will be now explained in detail by the example of illuminating a digit '1' in seven different colors. To display decimal number '1', a BCD code 0001 is applied to the inputs A0, A1, A2, A3 of common anode 7-segment decoder 24. The decoder 24 develops low voltage levels at its outputs b, c, to illuminate segments b, c, and high voltage levels at all remaining outputs (not shown), to extinguish all remaining segments.

To illuminate display element 43 in red color, color control input R is raised to a high logic level, while all remaining color control inputs are maintained at a low logic level. As a result, the output of OR gate 61a rises to a high logic level, thereby causing the output of buffer 62a to rise to a high logic level. The current flows from the output of buffer 62a, via red bus 5, red LED 2b, to the output b of decoder 24, and, via red LED 2c, to the output c of decoder 24. As a result, segments b, c illuminate in red color, thereby causing a visual impression of a character '1'. The green LEDs 3b, 3c and blue LEDs 4b, 4c remain extinguished because green bus 6 and blue bus 7 are disabled.

To illuminate display element 43 in green color, color control input G is raised to a high logic level, while all remaining color control inputs are maintained at a low logic level. As a result, the output of OR gate 61b rises to a high logic level, thereby causing the output of buffer 62b to rise to a high logic level. The current flows from the output of buffer 62b, via green bus 6, green LED 3b, to the output b of decoder 24, and, via green LED 3c, to the output c of decoder 24. As a result, segments b, c illuminate in green color.

To illuminate display element 43 in blue color, color control input B is raised to a high logic level, while all remaining color control inputs are maintained at a low logic level. As a result, the output of OR gate 61c rises to a high logic level, thereby causing the output of buffer 62c to rise to a high logic level. The current flows from the output of buffer 62c, via blue bus 7, blue LED 4b, to the output b of decoder 24, and, via blue LED 4c, to the output c of decoder 24. As a result, segments b, c illuminate in blue color.

To illuminate display element 43 in yellow color, color control input Y is raised to a high logic level, while all remaining color control inputs are maintained at a low logic level. As a result, the outputs of OR gates 61a, 61b rise to a high logic level, thereby causing the outputs of buffers 62a, 62b to rise to a high logic level. The current flows from the output of buffer 62a, via red bus 5, red LED 2b, to the output b of decoder 24, and, via red LED 2c, to the output c of decoder 24. The current also flows from the output of buffer 62b, via green bus 6, green LED 3b, to the output b of decoder 24, and, via green LED 3c, to the output c of the decoder 24. As a result of blending light of red and green colors, segments b, c illuminate in substantially yellow color.

To illuminate display element 43 in purple color, color control input P is raised to a high logic level, while all remaining color control inputs are maintained at a low logic level. As a result, the outputs of OR gates 61a, 61c rise to a high logic level, thereby causing the outputs of buffers 62a, 62c to rise to a high logic level. The current flows from the output of buffer 62a, via red bus 5, red LED 2b, to the output b of decoder 24, and, via red LED 2c, to the output c of decoder 24. The current also flows from the output of buffer 62c, via blue bus 7, blue LED 4b, to the output b of decoder 24, and, via blue LED 4c, to the output c of decoder 24. As a result of blending light of red and blue color, segments b, c illuminate in substantially purple color.

To illuminate display element 43 in blue-green color, color control input BG is raised to a high logic level, while all remaining color control inputs are maintained at a low logic level. As a result, the outputs of OR gates 61b, 61c rise to a high logic level, thereby causing the outputs of buffers 62b, 62c to rise to a high logic level. The current flows from the output of buffer 61b, via green bus 6, green LED 3b, to the output b of decoder 24, and, via green LED 3c, to the output c of decoder 24. The current also flows from the output of decoder 62c, via blue bus 7, blue LED 4b, to the output b of decoder 24, and, via blue LED 4c, to the output c of decoder 24. As a result of blending light of green and blue colors, segments b, c illuminate in substantially blue-green color.

To illuminate display element 43 in white color, color control input W is raised to a high logic level, while all remaining color control inputs are maintained at a low logic level. As a result, the outputs of OR gates 61a, 61b, 61c rise to a high logic level, thereby causing the outputs of respective buffers 62a, 62b, and 62c to rise to a high logic level. The current flows from the output of buffer 62a, via red bus 5, red LED 2b, to the output b of decoder 24, and, via red LED 2c, to the output c of decoder 24. The current also flows from the output of buffer 62b, via green bus 6, green LED 3b, to the output b of decoder 24, and, via green LED 3c, to the output c of decoder 24. The current also flows from the output of buffer 62c, via blue bus 7, blue LED 4b, to the output b of decoder 24, and, via blue LED 4c, to the output c of decoder 24. As a result of blending light of red, green, and blue colors, segments b, c illuminate in substantially white color.

Since the outputs of 7-segment decoder 24 may be overloaded by driving a triad of LEDs in parallel in display element 43, rather than a single LED in a monochromatic display, it would be obvious to employ suitable buffers to drive respective color display segments (not shown).

In FIG. 4, red light emitting diode 2e, green light emitting diode 3e, and blue light emitting diode 4e are placed on the base of a segment body 15b, which is filled with transparent light scattering material 16. Red LEDs are typically manufactured by diffusing a p-n junction into a GaAsP epitaxial layer on a GaAs substrate; green LEDs typically use a GaP epitaxial layer on a GaP substrate; blue LEDs are typically made from SiC material.

When forwardly biased, light emitting diodes 2e, 3e, and 4e emit light signals of red, green, and blue colors, respectively, which are scattered within transparent material 16, thereby blending the red, green, and blue light signals into a composite light signal that emerges at the upper surface of segment body 15b. The color of the composite light signal may be controlled by varying the portions of the red, green, and blue light signals.

To illustrate how the present invention can be utilized in multi-element multicolor display configuration, in FIG. 5 is shown a detail of the interconnection in a 2-primary color 4-digit display. The color control inputs R, Y, and G of all display elements 46a, 46b, 46c, and 46d are interconnected, respectively, and the enable inputs E1, E2, E3, and E4 are used to control the conditions of respective display elements. A high logic level at the enable input E extinguishes the particular display element. A low logic level at the enable input E illuminates the display element in a color determined by the instant conditions of the color control inputs R, Y, and G.

Figure 6:
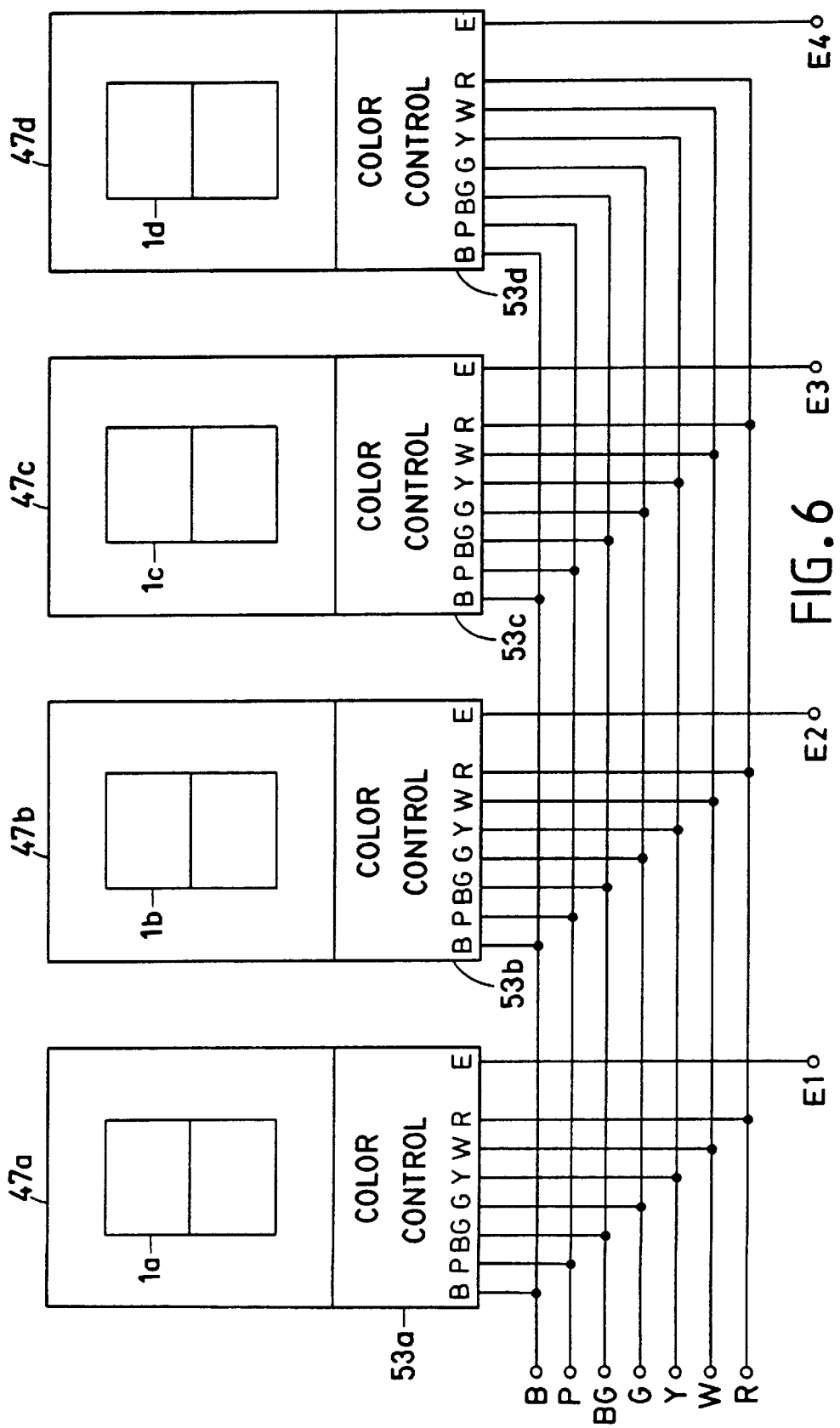
FIG. 6 is a block diagram of a 3-primary color multicolor 4-digit display.

In FIG. 6 is shown a like detail of the interconnection in a 3-primary color 4-digit display. Similarly, the color control inputs B, P, BG, G, Y, W, and R of all display elements 47a, 47b, 47c, and 47d are interconnected. The conditions of respective display elements are controlled by the enable inputs E1, E2, E3, and E4. A high logic level at the enable input E extinguishes the particular display element. A low logic level therein illuminates the display element in a color determined by the instant conditions of the color control logic inputs B, P, BG, G, Y, W, and R.

In brief summary, the invention describes a multicolor display element which comprises a plurality of display areas arranged in a pattern for exhibiting, upon selective activation, a plurality of display units. Each said display area includes a first light emitting diode for emitting, when forwardly biased, light signals of a first primary color, a second light emitting diode for emitting, when forwardly biased, light signals of a second primary color, and means for combining said light signals in the display area to obtain a light signal of a composite color. Each light emitting diode includes a first terminal and a second terminal. All first terminals are of the same polarity, and all second terminals are of the same polarity, opposite of the polarity of the first terminals. The display element further includes a plurality of decoder inputs for receiving decoder signals for selectively activating the light emitting diodes in the display areas. The decoder inputs are equal in number to the plurality of the display areas and are respectively coupled to the first terminals of the light emitting diodes, in accordance with their positions in the pattern. A first bus is provided to which the second terminals of all first light emitting diodes are coupled. A second bus is further provided to which the second terminals of all second light emitting diodes are coupled. The invention resides in the provision of a first tri-state buffer and a second tri-state buffer, or like first semiconductor device and a second semiconductor device of controllable conductivity. The first tri-state buffer includes a buffer control input, for receiving a buffer control signal having an active level, for causing the first tri-state buffer to be conductive, and an inactive level, for causing the first tri-state buffer to be non-conductive, The first nri-state buffer further includes a buffer input, for receiving first color control signals, and a buffer output, coupled to the first bus. The second tri-state buffer includes a buffer control input, for receiving a buffer control signal having an active level, for causing the second tri-state buffer to be conductive, and an inactive level, for causing the second tri-state buffer to be non-conductive. The second tri-state buffer further includes a buffer input, for receiving second color control signals, and a buffer output, coupled to the second bus. A single enable input is provided for receiving an enable signal having an active level and an inactive level. The buffer control input of the first tri-state buffer and the buffer control input of the second tri-state buffer are jointly connected to the enable input; As a result, the enable signal of the active level causes the first bus and the second bus to be conductive, for illuminating those of the first light emitting diodes and those of the second light emitting diodes selected by the decoder signals, in a color in accordance with the first color control signals and the second color control signals, and the enable signal of the inactive level causes the first bus and the second bus to be non-conductive, for extinguishing all first light emitting diodes and second light emitting diodes.

It would be obvious, in the view of the present disclosure, that other types of gates, or like devices, may be also used in the design of the multicolor display element of the invention. It would be further obvious that the hardware design of the present invention may be also implemented by software. It would be further obvious that persons skilled in the art may resort to modifications in the construction of the preferred embodiment described herein, without departing from the spirit and scope of the invention as defined in the appended claims. It is contemplated that the principles of the invention are also applicable to numerous diverse types of display devices, such as luminescent devices, liquid crystal display devices, plasma display devices, fluorescent display devices, cathode ray tube display devices and the like.

CORRELATION TABLE

This is a correlation table of reference characters used in the drawings herein, their descriptions, and examples of commercially available parts.

| # | DESCRIPTION | EXAMPLE |
|---|---|---|
| 2 | red LED | |
| 3 | green LED | |
| 4 | blue LED | |
| 5 | red bus | |
| 6 | green bus | |
| 7 | blue bus | |
| 15 | segment body | |
| 16 | light scattering material | |
| 23 | common cathode 7-segment decoder | 74LS49 |
| 24 | common anode 7-segment decoder | 74LS47 |
| 42 | multicolor 7-segment display element (2 LEDs) | |
| 43 | multicolor 7-segment display element (3 LEDs) | |
| 46 | one multicolor display character (2 LEDs) | |
| 47 | one multicolor display character (3 LEDs) | |
| 52 | color control (2 LEDs) | |
| 53 | color control (3 LEDs) | |
| 60 | 2-input OR gate | 74HC32 |
| 61 | 4-input OR gate | 4072 |
| 62 | non-inverting buffer | 74LS244 |
| 63 | inverting buffer | 74LS240 |
| 64 | inverter | part of 74LS240,4 |

The parts in the Correlation Table are merely exemplary. It would be obvious to those skilled in the art that other components may be readily and effectively used.

What I claim is:

1. A multicolor display element comprising:

a plurality of display areas arranged in a pattern for exhibiting, upon selective activation, a plurality of display units, each said display area including a plurality of light emitting diodes for emitting, when forwardly biased, light signals of respective primary colors and means for combining said light signals in said display area to obtain a light signal of a composite color;

means for selectively forwardly biasing said light emitting diodes for exhibiting a desired display unit;

a plurality of color control inputs for selectively receiving color control signals, each said color control signal having a single active level, for illuminating said display unit in a desired color; and a single enable input for selectively allowing and not allowing, in accordance with an enable signal, said color control signals to illuminate said display unit.

2. A multicolor display element comprising:

a plurality of display areas arranged in a pattern for exhibiting, upon selective activation, a plurality of display units, each said display area including a plurality of light emitting diodes for emitting, when forwardly biased, light signals of respective primary colors and means for combining said light signals in said display area to obtain a light signal of a composite color;

means for selectively forwardly biasing said light emitting diodes for exhibiting a desired display unit;

a plurality of color control inputs for selectively receiving color control signals, each said color control signal having a single active level, for illuminating said display unit in a desired color; and a single enable input for an enable signal for selectively allowing said color control signals to illuminate said display unit and for not allowing said color control signals to illuminate said display unit.

\* \* \* \* \*